United States Patent
Kim et al.

(10) Patent No.: US 10,186,403 B2
(45) Date of Patent: Jan. 22, 2019

(54) TABLET FOR PLASMA COATING SYSTEM, METHOD OF MANUFACTURING THE SAME, AND METHOD OF MANUFACTURING A THIN FILM USING THE METHOD OF MANUFACTURING THE TABLET

(71) Applicant: Samsung Display Co., Ltd., Yongin-si, Gyeonggi-do (KR)

(72) Inventors: Hun Kim, Yongin-si (KR); Jin-Woo Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 122 days.

(21) Appl. No.: 14/875,614

(22) Filed: Oct. 5, 2015

(65) Prior Publication Data
US 2016/0027622 A1    Jan. 28, 2016

Related U.S. Application Data

(62) Division of application No. 13/968,352, filed on Aug. 15, 2013, now Pat. No. 9,196,464.

(30) Foreign Application Priority Data

Apr. 30, 2013  (KR) .................... 10-2013-0048501

(51) Int. Cl.
| | |
|---|---|
| *H01L 21/00* | (2006.01) |
| *H01J 37/34* | (2006.01) |
| *C23C 14/08* | (2006.01) |
| *C23C 14/30* | (2006.01) |
| *C23C 14/32* | (2006.01) |
| *B05D 3/00* | (2006.01) |

(Continued)

(52) U.S. Cl.
CPC .......... *H01J 37/3426* (2013.01); *B05D 3/007* (2013.01); *C23C 14/086* (2013.01);
(Continued)

(58) Field of Classification Search
CPC ....... C23C 14/086; C23C 14/30; C23C 14/32; C23C 14/352; C23C 14/3464; C23C 14/3414; B05D 3/007; H01J 37/3426; H01J 37/3423; H01J 37/3429; H01J 37/3414; H01J 37/2429
(Continued)

(56) References Cited

U.S. PATENT DOCUMENTS 5,698,341 A * 12/1997 Tamaki ............... C01B 31/04
                                                      423/275
7,588,669 B2 * 9/2009 Guo ................... C23C 14/352
                                                      204/298.08
(Continued)

FOREIGN PATENT DOCUMENTS

| JP | 11-106903 A | 4/1999 |
|---|---|---|
| JP | 2002-030428 A | 1/2002 |

(Continued)

*Primary Examiner* — Kevin M Picardat
(74) *Attorney, Agent, or Firm* — Lewis Roca Rothgerber Christie LLP

(57) ABSTRACT

A tablet for a plasma coating system having a first part that includes a first material having a first sublimation point at a first pressure and a second part that is disposed on the first part and comprises a second material having a second melting point at the first pressure, wherein the second melting point is lower than the first sublimation point.

12 Claims, 3 Drawing Sheets

(51) Int. Cl.
*H01L 51/56* (2006.01)
*C23C 14/34* (2006.01)

(52) U.S. Cl.
CPC .............. C23C 14/30 (2013.01); C23C 14/32 (2013.01); H01J 37/3423 (2013.01); H01J 37/3429 (2013.01); *C23C 14/3464* (2013.01); *H01L 51/56* (2013.01); *Y10T 428/2991* (2015.01)

(58) Field of Classification Search
USPC ............................................ 438/46, 47, 780
See application file for complete search history.

(56) References Cited

U.S. PATENT DOCUMENTS

| | | |
|---|---|---|
| 2007/0141235 A1 | 6/2007 | Sung |
| 2009/0243467 A1* | 10/2009 | Shimizu ............. C09K 11/7734 313/503 |
| 2009/0305066 A1* | 12/2009 | Hommura ............. C23C 14/086 428/480 |
| 2011/0031109 A1* | 2/2011 | Lee ..................... C23C 14/3407 204/192.12 |
| 2011/0135915 A1* | 6/2011 | Lee ....................... C23C 14/083 428/336 |
| 2013/0009147 A1* | 1/2013 | Koyama ........... H01L 21/02422 257/43 |
| 2014/0021174 A1* | 1/2014 | Miyasaka .......... B23K 35/0261 219/121.45 |
| 2015/0041793 A1 | 2/2015 | Chan et al. |

FOREIGN PATENT DOCUMENTS

| | | |
|---|---|---|
| KR | 10-2007-0033943 A | 3/2007 |
| KR | 10-2012-0087992 A | 8/2012 |
| WO | WO 2012/063525 A1 | 5/2012 |

* cited by examiner

__US 10,186,403 B2__

TABLET FOR PLASMA COATING SYSTEM, METHOD OF MANUFACTURING THE SAME, AND METHOD OF MANUFACTURING A THIN FILM USING THE METHOD OF MANUFACTURING THE TABLET

CROSS-REFERENCE TO RELATED APPLICATION

This application is a divisional of U.S. patent application Ser. No. 13/968,352, filed Aug. 15, 2013, which claims priority to and the benefit of Korean Patent Application No. 10-2013-0048501, filed Apr. 30, 2013, the entire content of both of which is incorporated herein by reference.

BACKGROUND

1. Field

Embodiments of the present invention relate to a tablet for a plasma coating system, a method of manufacturing the same, and a method of manufacturing a thin film using the method of manufacturing the tablet for the plasma coating system.

2. Description of the Related Art

Organic light-emitting display devices are emissive display devices having of a large viewing angle, a high contrast, a rapid response time, high characteristics with respect to brightness, driving voltage, and response speed, and may display a multi-color image.

An organic light-emitting display device may include an organic light-emitting device. The organic light-emitting device may be easily degraded by moisture and oxygen. Accordingly, the organic light-emitting display device includes an encapsulating structure for sealing the organic light-emitting device from moisture and oxygen. The encapsulating structure may be formed of a sealing thin film. The sealing thin film may be formed of an inorganic material and the inorganic material may be formed as a thin film by using various methods. However, when a sealing thin film is formed by using a plasma coating system, ashes, particles, and airbourne materials that are generated in a process of subliming an inorganic material may be included in the sealing thin film, and thus, the reliability of the sealing thin film may be reduced.

SUMMARY

Embodiments of the present invention provide a tablet for a plasma coating system for forming a thin film, a method of manufacturing the same, and a method of manufacturing the thin film using the method of manufacturing the tablet for the plasma coating system.

According to an aspect of the embodiment, there is provided a tablet for a plasma coating system, the tablet including: a first part that comprises a first material having a first sublimation point at a first pressure; and a second part that is disposed on the first part and comprises a second material having a second melting point at the first pressure, wherein the second melting point is lower than the first sublimation point.

The first material may be a tin oxide.

The second material may be tin.

The second material may be a mixture that includes at least one of a tin oxide, a phosphorus oxide, a boron phosphate, a tin fluoride, a niob oxide, a zinc oxide, a boron oxide, or a tungsten oxide.

The second part may occupy a volume in a range from about 10% to about 50% of the whole tablet and the first part may occupy a volume in a range from about 50% to about 90% of the whole tablet.

A central portion of an upper surface of the first part may be concaved towards a lower surface of the first part.

The second part may be formed as a single piece or a plurality of pieces.

According to an aspect of the embodiment, there is provided a method of forming a tablet that includes a first part and a second part for a plasma coating system, the method including: forming the first part by grinding, compressing, and sintering a first material having a first sublimation point at a first pressure; and forming a second part by locating a second material having a second melting point at the first pressure on the upper surface of the first part, wherein the second melting point is lower than the first sublimation point.

The first material may be a tin oxide.

The second material may be tin.

The second material may be a mixture that includes at least one of a tin oxide, a phosphorus oxide, a boron phosphate, a tin fluoride, a niob oxide, a zinc oxide, a boron oxide, or a tungsten oxide.

The method may further include forming a central portion of an upper surface of the first part to be concaved towards a lower surface of the first part.

The second part may be formed as a single piece or in a plurality of pieces.

According to an aspect of the embodiment, there is provided a method of manufacturing a thin film by using a tablet for plasma coating system, wherein the tablet includes: a first part that includes a first material having a first sublimation point at a first pressure; and a second part that is disposed on the first part and includes a second material having a second melting point at the first pressure, wherein the second melting point is lower than the first sublimation point, the method including: heating a crucible that accommodates the tablet; exposing an edge portion of an upper surface of the first part by the melted second material being collected in a central portion of the upper surface of the first part; sublimating the first material from an edge portion of the exposed upper surface of the first part; and forming a thin film on a body that is to undergo deposition by the sublimated first material.

The crucible may be heated by adsorbing electrons emitted from an ion gun.

The scattered materials discharged from the first part are adsorbed by the melted second material.

The thin film may be a sealing thin film that seals an organic light-emitting device.

According to the embodiment, in a process of forming a thin film by using a plasma coating system, ashes, particles, and airbourne materials that may be generated from the tablet are reduced, and thus, the reliability of the thin film may be increased.

BRIEF DESCRIPTION OF THE DRAWINGS

The above and other features and advantages of the embodiment will become more apparent by describing in detail exemplary embodiments thereof with reference to the attached drawings in which.

DETAILED DESCRIPTION

Figure 1:
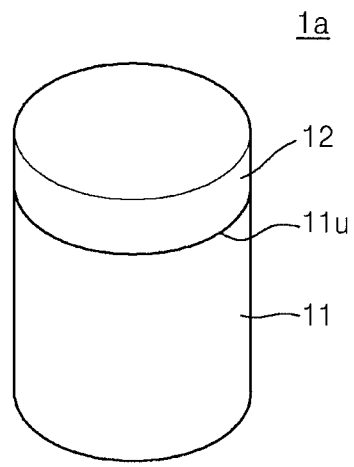
FIG. 1 is a perspective view illustrating a tablet for a plasma coating system, according to an embodiment.

In the current specification, parts that are not related to the embodiment may be omitted from the drawings and may not be described or may be briefly shown in the drawings and briefly described. Also, in the drawings, lengths and sizes of layers and regions may be exaggerated for clarity.

Like reference numerals are used for elements that are substantially identical or correspond to each other throughout the description of the figures. The terms 'first', 'second', etc. in the current specification may be used herein to describe various elements, and these elements should not be limited by these terms but are only used to distinguish one element from another. Also, it will be understood that when a layer, a region, or an element is referred to as being "formed on," another element or layer, it may include a case when the layer, the region, or the element is directly formed on the other layer, region, or element and a case when the layer, the region, or the element is indirectly formed with an intervening layer, a region, or an element therebetween.

The embodiments are related to a plasma coating system.

The plasma coating system is a kind of thin film forming system.

In the plasma coating system, a thin film is formed based on a principle that when positive ions and electrons generated from an ion generator are supplied into a chamber, the supplied electrons are absorbed in a crucible where the tablet is accommodated, and thus, the tablet is heated and the solid material that constitutes the tablet is sublimated into a gas that is deposited on a body which is to undergo deposition.

The ion generator may be an ion gun. When an inert gas, for example, argon gas, is injected into a tube in the gun, plasma is generated due to a magnetic field, an electric field, and heat formed around the tube, and as a result, argon is ionized into argon positive ions and electrons. The gun supplies the positive ions and the electrons into the chamber.

The chamber is maintained at a vacuum state or at a low pressure.

A crucible in which a tablet is accommodated is disposed in the chamber. A body which is to undergo deposition, such as a substrate or a substrate on which an organic light-emitting device is disposed, is disposed on a location facing the tablet. The crucible may be formed of a metal having high heat conductivity, such as copper or tungsten. The electrons supplied into the chamber heat the tablet by being absorbed in the crucible. An edge portion of the tablet that contacts the crucible is heated earlier than a center portion of the tablet, and thus, the edge portion of the tablet is sublimated and forms a thin film on the body which is to undergo deposition.

The plasma coating system employs a method of forming a thin film on a body which is to undergo deposition by sublimating a material included in a tablet by applying heat thereto.

A sputtering system employs a method of forming a thin film on a body which is to undergo deposition by a target material that is ejected from a target when argon positive ions in plasma collide with a surface of the target by being accelerated towards the target.

Accordingly, the sputtering system utilizes a low current and a high voltage, and also, since a target material having a large kinetic energy collides with a body which is to undergo deposition, there may be damage to the body which is to undergo deposition. However, the plasma coating system utilizes a high current and a low voltage, and also, since a tablet material is sublimated by heat, there is little damage to the body which is to undergo deposition.

Hereinafter, a tablet for plasma coating system and a method of forming the tablet will be described in detail.

Figure 2:
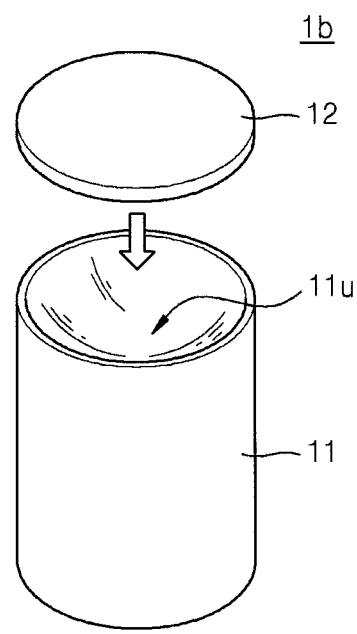
FIGS. 2 and 3 are perspective views illustrating tablets for a plasma coating system, according to another embodiment.
Figure 3:
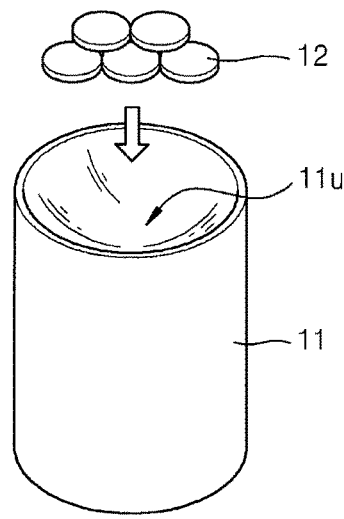

FIG. 1 is a perspective view illustrating a tablet 1a for a plasma coating system, according to an embodiment. FIGS. 2 and 3 are perspective views illustrating tablets 1b and 1c for a plasma coating system, according to other embodiments.

The tablet 1a includes a first part 11 and a second part 12. The second part 12 is located on an upper surface 11u of the first part 11. Here, the upper surface 11u of the first part 11 denotes an outer surface of the tablet 1a that faces the body which is to undergo deposition. A lower surface of the first part 11 denotes a surface of the first part 11 that does not face the body which is to undergo deposition and is opposite to the upper surface 11u.

The first part 11 includes a first material that has a first sublimation point at a first pressure. For example, the first material may be a solid state tin oxide (for example, SnO or $SnO_2$). In the case of tin oxide, the tin oxide may have a first sublimation point in a range from about 500° C. to about 600° C. under a low pressure of 1 atm or less. Here, the first pressure denotes an internal pressure of a chamber when a tablet is placed in the chamber of a plasma coating system for forming a thin film. Accordingly, the first pressure may be a low pressure state of less than 1 atm, but is not limited thereto, that is, may be a vacuum state of approximately 1/1000 mmHg. The first material is not limited to the tin oxide, but may be various materials that are appropriate for forming a thin film and satisfy the above conditions.

The second part 12 includes a second material that is different from the first material. The second material has a second melting point at the first pressure. For example, the second material may be solid state tin (Sn). In the case of Sn, Sn may have a melting point of approximately 400° C. at a low pressure of less than 1 atm. As another example, the second material may be a solid state mixture that includes at least one of a tin oxide (for example, SnO or $SnO_2$), a phosphorus oxide (for example, $P_2O_5$), a boron phosphate (for example, $BPO_4$), a tin fluoride (for example, $SnF_4$), a niob oxide (for example, NbO), a zinc oxide (for example, ZnO), a boron oxide (for example, $B_2O_3$) or a tungsten oxide (for example, $WO_3$). In the case of the mixture described above, the mixture may have a melting point of approximately 300° C. or less at a low pressure state of 1 atm or less.

For example, the second material may be as follows, but is not limited thereto.
-. SnO and $P_2O_5$;
-. SnO and $BPO_4$;
-. SnO, $SnF_2$, and $P_2O_5$;
-. SnO, $SnF_2$, $P_2O_5$, and NbO;
-. SnO, $SnF_2$, $P_2O_5$, and $WO_3$;
-. SnO, $P_2O_5$, and $B_2O_3$;
-. SnO, $P_2O_5$, $B_2O_3$, and ZnO; and
-. SnO, $B_2O_3$, ZnO, and $SiO_2$ For example, the second material may have one of compositions shown below, but is not limited thereto.
-. SnO (80 mol %) and $P_2O_5$ (20 mol %);
-. SnO (90 mol %) and $BPO_4$ (10 mol %);

-. SnO (20-50 mol %), SnF$_2$ (30-60 mol %), and P$_2$O$_5$ (10-30 mol %) (wherein, a sum of SnO, SnF$_2$, and P$_2$O$_5$ is 100 mol %);

-. SnO (20-50 mol %), SnF$_2$ (30-60 mol %), P$_2$O$_5$ (10-30 mol %), and NbO (1-5 mol %) (wherein, a sum of SnO, SnF$_2$, P$_2$O$_5$, and NbO is 100 mol %);

-. SnO (20-70 mol %), P$_2$O$_5$ (5-50 mol %), and B$_2$O$_3$ (5-50 mol %) (wherein, a sum of SnO, P$_2$O$_5$, and B$_2$O$_3$ is 100 mol %);

-. SnO (20-70 mol %), P$_2$O$_5$ (5-50 mol %), B$_2$O$_3$ (5-50 mol %), and ZnO (5-20 mol %) (wherein, a sum of SnO, P$_2$O$_5$, B$_2$O$_3$, and ZnO is 100 mol %); and -. SnO (20-70 mol %), B$_2$O$_3$ (5-50 mol %), ZnO (5-20 mol %), and SiO$_2$ (5-20 mol %) (wherein, a sum of SnO, B$_2$O$_3$, ZnO, and SiO$_2$ is 100 mol %).

According to an embodiment, the second melting point of the second material may be lower than the first sublimation point of the first material under the first pressure. That is, since the second material having a low melting point is placed above the tablet 1a, the second material melts above the tablet 1a before the sublimation of the first material, and thus, the melted second material adsorbs ash, particles, and scattered materials generated when the first material is sublimated. In this way, ash, particles, and scattered materials are not included in a thin film that is formed on a body which is to undergo deposition. Therefore, a thin film having high reliability may be formed.

Hereinafter, appearance and shape of the tablet 1a together with a method of forming the tablet 1a will be described.

According to the embodiment, the tablet 1a may have, for example, a cylindrical shape. However, the shape of the tablet 1a according to the current embodiment is not limited thereto and may have various shapes. The shape of the tablet 1a may be formed to correspond to an inner shape of a crucible that accommodates the tablet 1a.

The first part 11 and the second part 12 of the tablet 1a according to the current embodiment may be separately formed. First, a method of forming the first part 11 will be described. A first material is crushed and ground to form a powder. Afterwards, the powder is compressed and sintered to have a predetermined shape by applying heat and pressure. In a process of compressing and sintering the powder, if necessary, a volatile binder may be added.

Next, a method of forming the second part 12 will be described. A second material is crushed and ground to form a powder. Afterwards, the powder is compressed and sintered to have a predetermined shape by applying heat and pressure. In a process of compressing and sintering the powder, if necessary, a volatile binder may be added.

Next, the tablet 1a according to the current embodiment may be formed by simply placing or attaching the second part 12 on the upper surface 11u of the first part 11. The second part 12 may be simply disposed on the first part 11 or may be attached to the first part 11 by using a bonding material.

Referring to FIG. 1, the first part 11 may occupy a volume in a range from about 50% to about 90% of the whole tablet 1a, and the second part 12 may occupy a volume in a range from about 10% to about 50% of the whole tablet 1a. For example, when the tablet 1a has a cylindrical shape having a diameter of about 30 mm and a height of about 40 mm, the first part 11 may have a cylindrical shape having a diameter of about 30 mm and a height of about 30 mm, and the second part 12 may have a cylindrical shape having a diameter of about 30 mm and a height of about 10 mm and may be disposed on the upper surface 11u of the first part 11.

According to the current embodiment, upper surfaces 11u of first parts 11 of the tablet 1b and 1c are concavely formed, and afterwards, second parts 12 are formed in the concavely formed upper surfaces 11u. A method of forming the first part 11 will now be described. First, a first material is crushed and ground to form a powder. Afterwards, the powder is compressed and sintered to have a predetermined shape by applying heat and pressure. In a process of compressing and sintering the powder, if necessary, a volatile binder may be added.

Next, a central portion 11c of the upper surface 11u of the first part 11 is concavely processed towards a lower surface.

Next, a method of forming the second part 12 will be described. A second material is crushed and ground to form a powder. Afterwards, the powder is compressed and sintered to have a predetermined shape by applying heat and pressure. In a process of compressing and sintering the powder, if necessary, a volatile binder may be added.

At this point, as depicted in FIG. 2, the second part 12 may be formed as a single piece. However, the shape of the second part 12 is not limited thereto. That is, as depicted in FIG. 3, the second part 12 may be formed in a plurality of pieces.

Next, the tablet 1b and 1c according to the current embodiments may be formed by simply placing or bonding the second part 12 on the upper surface 11u of the first part 11.

As depicted in FIGS. 2 and 3, when a concaved portion is formed on the upper surface 11u of the first part 11, the melted second material may be prevented from overflowing to the outside of the crucible. The melt may flow into the concave portion of the upper surface 11u of the first part 11 by gravity and may form drops, and thus, an upper edge unit 11p (See FIG. 4) of the first part 11 is exposed. The first material is readily sublimated from the exposed portion of the first part 11 to form a thin film on a body which is to undergo deposition.

As described with reference to FIG. 1, in the case of the tablets 1b and 1c of FIGS. 2 and 3, the first part 11 and the second part 12 may have similar volume ratios.

Hereinafter, a process of forming a thin film through a plasma coating system 100 by using one of the tablets 1a, 1b, and 1c of FIGS. 1, 2, and 3 will be described.

Figure 4:
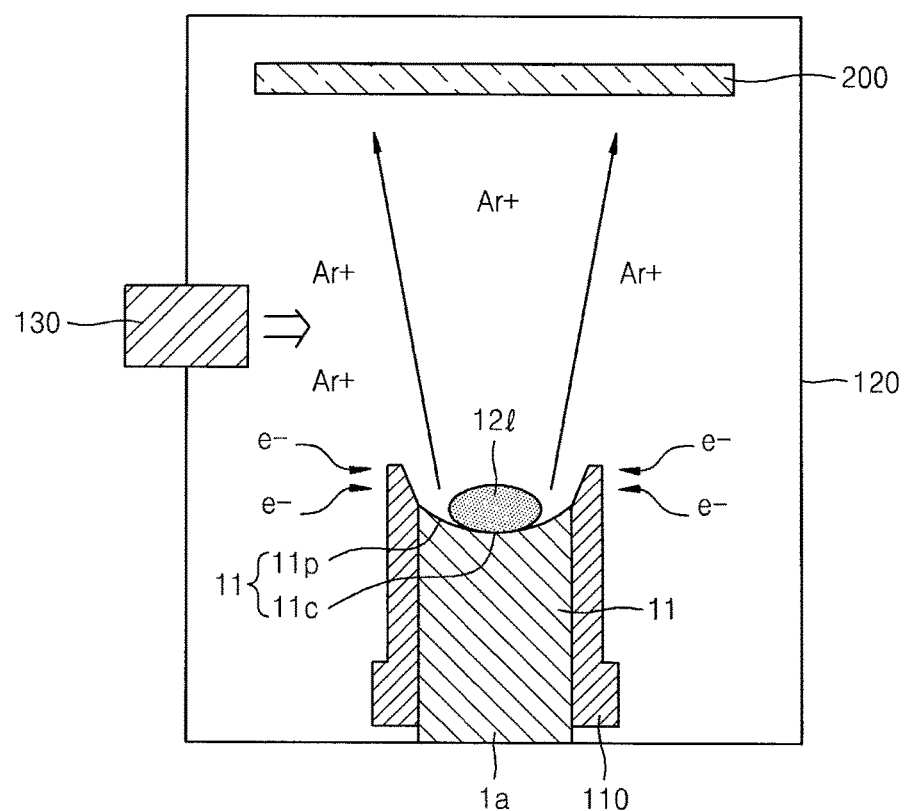
FIG. 4 is a schematic cross-sectional view showing a process of forming a thin film by using a tablet according to an embodiment.
Figure 5:
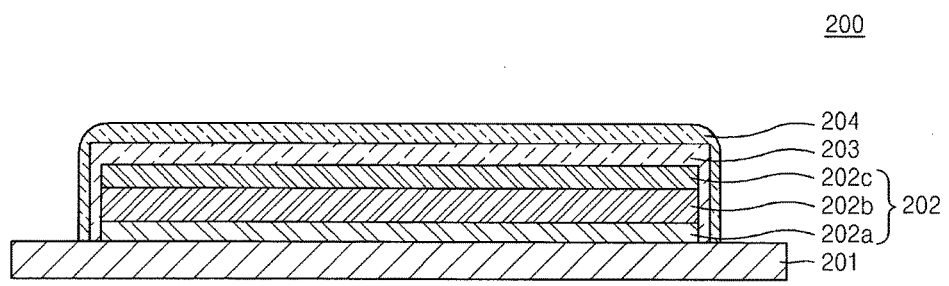
FIG. 5 is a cross-sectional view of an organic light-emitting display device sealed by a sealing thin film by using a tablet according to an embodiment.

FIG. 4 is a schematic cross-sectional view showing a process of forming a thin film through the plasma coating system 100 in which one of the tablets 1a, 1b, and 1c according to embodiments are included. FIG. 5 is a cross-sectional view of an organic light-emitting display device 200 that is sealed by a sealing thin film by using a tablet according to an embodiment.

The tablet 1a and a body 200 which is to undergo deposition (the organic light-emitting display device 200) are disposed in a chamber 120 of the plasma coating system 100. The tablet 1a and the body 200 which is to undergo deposition are disposed to face each other because a first material sublimated from the tablet 1a forms a thin film on the body 200 which is to undergo deposition.

Argon positive ions Ar+ and electrons e− are generated from an ion generator 130, and the argon positive ions Ar+ spread in the chamber 120 and the electrons e− are absorbed in a crucible 110. The crucible 110 is heated by absorbing the electrons e−. At this point, heat is transmitted from an edge portion of the tablet 1a, and thus, the edge portion of the tablet 1a has a temperature higher than that of the central portion. Meanwhile, since the melting point of the second material included in the second part 12 that is disposed on the upper surface 11u of the first part 11 is lower than the sublimation temperature of the first material that is included in the first part 11, the second material melts earlier than when the first material is sublimated and forms a melted second material 121.

In the case of the tablets 1b, and 1c of FIGS. 2 and 3, since a central portion 11c of the upper surface 11u of the first part 11 is concavely formed, the melted second material 121 is collected in the concaved portion. In the case of the tablet 1a of FIG. 1, as the process progresses, since the argon positive ions Ar+ collide with the upper central surface of the tablet 1a, the central portion 11c of the first part 11 is concavely formed. This is because, since the electrons e− are adsorbed to the crucible 110, an edge portion of the tablet 1a has a relatively negative polarity, and thus, the argon positive ions Ar+ are accelerated to and collided with a central portion of the tablet 1a, and as a result, the upper central portion of the first part 11 is etched. Accordingly, in the case of the tablet 1a of FIG. 1, as the process progresses, the melted second material 121 is collected in the concaved central portion 11c of the upper surface 11u of the first part 11.

Accordingly, the second material is collected in the central portion 11c of the first part 11, and the first material is exposed from the upper edge portion 11p of the first part 11. When the temperature of the crucible 110 reaches the sublimation temperature of the first material as the crucible 110 is heated, the first material is sublimated from the exposed edge portion 11p.

Referring to FIG. 5, the body 200 which is to undergo deposition according to the current embodiment may be a substrate 201 on which an organic light-emitting device 202 is located. At this point, the film forming process may be continuously performed by moving the substrate 201 in a particular direction.

The thin film formed by using the tablets 1a, 1 b, and 1c according to embodiments may be a sealing thin film 204 that seals the organic light-emitting device 202. The organic light-emitting device 202 is formed on the substrate 201. The organic light-emitting device 202 includes a lower electrode 202a, an intermediate layer 202b, and an upper electrode 202c, which are sequentially formed from the substrate 201. If necessary, the organic light-emitting device 202 may further include an organic auxiliary layer 203 on the upper electrode 202c to control a refractive index of the organic light-emitting device 202 and to protect the upper electrode 202c. The intermediate layer 202b of the organic light-emitting device 202 includes a plurality of organic layers formed of an organic material, and the organic layers are easily transformed by external moisture or oxygen. Accordingly, the organic layers are tightly sealed from the outside to ensure the reliability of the organic light-emitting device 202. Thus, the sealing thin film 204 that seals the organic light-emitting device 202 is formed.

According to the embodiments, the sealing thin film 204 may be formed of a tin oxide. In particular, a thin film formed by using the tablets 1a, 1b, and 1c according to embodiments do not include ash, particles, or scattered materials because the ash, particles, and scattered materials that are generated during a sublimation process of the first material are absorbed by the melted second material during the formation of the thin film.

The sputtering system and the plasma coating system described above are operated based on different operation principles, and therefore, the tablet according to an embodiment may not be used as a target of the sputtering system. Practically, when the tablet according to an embodiment was used as a target of the sputtering system, it was observed that normal film formation was difficult because a strong arc was generated during a sputtering operation due to an outgas generated by melting of the second part having a low melting point. Accordingly, the tablet according to an embodiment is distinguished from a target of the sputtering system.

While this embodiment has been particularly shown and described with reference to preferred embodiments thereof, it will be understood by those of ordinary skill in the art that the embodiment is not limited to the embodiments described above and various changes in form and details may be made therein without departing from the spirit and scope of the embodiment as defined by the appended claims.

What is claimed is:

1. A tablet for a plasma coating system, the tablet comprising:
    a first part that comprises a first material comprising tin oxide, and having a first sublimation point at a first pressure; and
    a second part that is disposed on, and in contact with, an upper portion of the first part and comprises a second material having a second melting point at the first pressure,
    wherein the second melting point is lower than the first sublimation point, and
    wherein melted portions of the second part are configured to collect in the upper portion of the first part before the first part sublimates.

2. The tablet of claim 1, wherein the second material is tin.

3. The tablet of claim 1, wherein the second material is a mixture that comprises at least one of a tin oxide, a phosphorus oxide, a boron phosphate, a tin fluoride, a niob oxide, a zinc oxide, or a boron oxide, and a tungsten oxide.

4. The tablet of claim 1, wherein the second part occupies a volume in a range from about 10% to about 50% of the whole tablet and the first part occupies a volume in a range from about 50% to about 90% of the whole tablet.

5. The tablet of claim 1, wherein the second part is formed in a single piece or a plurality of pieces.

6. A tablet for a plasma coating system, the tablet comprising:
    a first part that comprises a first material having a first sublimation point at a first pressure; and
    a second part that is disposed on the first part and comprises a second material having a second melting point at the first pressure,
    wherein the second melting point is lower than the first sublimation point, and
    wherein a central portion of an upper surface of the first part is concaved towards a lower surface of the first part.

7. A method of forming a tablet that comprises a first part and a second part for a plasma coating system, the method comprising:
    forming the first part by grinding, compressing, and sintering a first material having a first sublimation point at a first pressure; and
    forming a second part by locating a second material having a second melting point at the first pressure on an upper surface of the first part,
    wherein the second melting point is lower than the first sublimation point.

8. The method of claim 7, wherein the first material is a tin oxide.

9. The method of claim 7, wherein the second material is tin.

10. The method of claim 7, wherein the second material is a mixture that comprises at least one of a tin oxide, a phosphorus oxide, a boron phosphate, a tin fluoride, a niob oxide, a zinc oxide, or a boron oxide, and a tungsten oxide.

11. The method of claim 7, further comprising forming a central portion of an upper surface of the first part to be concaved towards a lower surface of the first part.

12. The method of claim 7, wherein the second part is formed as a single piece or in a plurality of pieces.

* * * * *